United States Patent
Jung

(10) Patent No.: US 7,166,534 B2
(45) Date of Patent: Jan. 23, 2007

(54) METHOD OF DRY CLEANING PHOTORESIST STRIPS AFTER VIA CONTACT ETCHING

(75) Inventor: Tae-Woo Jung, Kyoungki-Do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 481 days.

(21) Appl. No.: 10/253,384

(22) Filed: Sep. 24, 2002

(65) Prior Publication Data

US 2003/0114010 A1 Jun. 19, 2003

(30) Foreign Application Priority Data

Sep. 28, 2001 (KR) ................ 2001-60742

(51) Int. Cl.
*H01L 21/302* (2006.01)
*H01L 21/3065* (2006.01)

(52) U.S. Cl. .............. 438/700; 438/706; 438/710; 438/712; 438/723; 438/724; 438/725; 438/730; 252/79.1; 216/16; 134/1.1

(58) Field of Classification Search ........ 438/706, 438/710, 712, 723, 725, 730, 700, 724; 134/1.1; 216/16; 252/79.1
See application file for complete search history.

(56) References Cited

U.S. PATENT DOCUMENTS 5,849,639 A * 12/1998 Molloy et al. ............. 438/714
5,908,319 A * 6/1999 Xu et al. .................... 438/725
6,046,115 A * 4/2000 Molloy et al. .............. 438/710
6,130,166 A 10/2000 Yeh
6,316,348 B1 * 11/2001 Fu et al. ..................... 438/636
6,325,861 B1 * 12/2001 Stinnett ........................ 134/2
6,379,574 B1 * 4/2002 Ou-Yang et al. ............. 216/49
6,426,298 B1 * 7/2002 Chen et al. ................. 438/699
6,500,766 B2 * 12/2002 Lu et al. ..................... 438/706

OTHER PUBLICATIONS

Chen et al., Method for cleaning via on the semiconductor wafer prevents the metal layer from peeling off and eroding in the cleaning process, Apr. 1, 2001, English Abstract of TW 428245 A, 3 pages.*
Notice of Preliminary Rejection from Korean Intellectual Property Office dated Oct. 25, 2004.

* cited by examiner

*Primary Examiner*—Nadine G. Norton
*Assistant Examiner*—Lynette T. Umez-Eronini
(74) *Attorney, Agent, or Firm*—Marshall, Gerstein & Borun LLP

(57) ABSTRACT

Semiconductor manufacturing processes that reduce production costs as well as increase throughput by substituting the PR strip and ACT wet cleaning procedure after the via contact etching of a semiconductor with dry cleaning to be performed while removing a photoresist in a conventional PR strip apparatus. In addition, the methods can shorten waiting time and maintain consistency in the process by performing the PR strip and cleaning at the same time in the same chamber. The resultant devices have lower via contact resistance and its deviation, as compared to the conventional PR strip and ACT wet cleaning.

17 Claims, 2 Drawing Sheets

METHOD OF DRY CLEANING PHOTORESIST STRIPS AFTER VIA CONTACT ETCHING

BACKGROUND

1. Technical Field

A method for fabricating a semiconductor device and, more particularly, a method for stripping photoresist material and cleaning after via contact etching is disclosed.

2. Description of the Related Art

As the density and performance of current VLSI (Very Large Scale Integration) increases, the significance of a multi-layer metal interconnection line structure increases. A multi-layer structure is formed from a stack of metal interconnection lines and inter-layer insulation layers separating the interconnecting lines. For high performance of a semiconductor device, reduction of RC (resistor-capacitor) delay factors in the interconnection line structure is required. So, for metal interconnection lines, it is necessary to reduce the resistance values, and therefore copper (Cu) is used because its inherent resistance value is less than that of aluminum (Al). Whereas for insulation layers, an insulation layer with a low dielectric constant (low-k) is needed to reduce the capacity between the interconnection lines and between the layers.

Meanwhile, as the structure of interconnection lines becomes smaller with more layers, the via contact holes electrically connecting the interconnection lines become smaller while the via contact resistance increases. Via contact holes are formed after going through the mask process of depositing and developing a photoresist, and performing via contact etching.

Via contact etching is different from other contact etchings in that the lower layer of the insulation layer is metal. In other words, because the lower layer is metal, metal is sputtered physically while etching the insulation layer, and the sputtered metal atoms stick to the sidewalls or bottom of a contact hole and forms a residue. Containing many metallic components, the residue on the side and bottom of the via contact can be difficult to remove.

FIG. 1 is a cross-sectional view showing a semiconductor device after conventional via contact etching. An inter-metal insulation layer 105 is molded on top of metal lower interconnection lines 100 and a photoresist pattern is formed for via contact etching. A via contact hole is molded by etching the inter-metal insulation layer 105 with the photoresist pattern 120 being used as an etching barrier. Then, the photoresist pattern 120 is formed of two photoresists: one is a photoresist 110 which was not deformed during the etching procedure and the other is a photoresist 115 deformed by fluorine-based gas used for stripping the photoresist. Also, residue 125 containing metallic components is formed on the bottom and the sidewalls of the via holes.

Therefore, after via contact etching, the photoresist, residue and metal contamination all should be removed by performing a cleaning procedure. The conventional cleaning procedures after via contact etching are conducted in by stripping the photoresist, followed by wet-cleaning using ACT™ solvent and scrubbing before depositing a metal. The conventional method of stripping the photoresist and cleaning method will be described hereinafter.

First of all, the photoresist used as the barrier for via hole etching needs to be removed because it does not perform any function. To get rid of a photoresist, which consist of organic substances, a method of "burning", that is, a method reacting the photoresist with oxygen is commonly used. In other words, the photoresist resolves in an oxygen plasma as an oxygen atom excited in the plasma reacts to carbon in the photoresist and becomes a carbon dioxide.

However, photoresist polymer materials have a complicated chemical structure, so the actual oxygen resolution reaction is not straight forward and, often, is not complete. Also, in case there are non-volatile substances among the oxide substances of the components of the photoresist, they may be oxidized and became a residue during the ashing procedure. As seen above, it is not easy to remove a photoresist deformed by ions or etching gases, and as the integration of a semiconductor device gets higher, if the size of the interconnection lines shrinks, the remaining bit of a photoresist may trigger a defect and be a culprit for disconnection and short circuit, thereby dropping the throughput.

Meanwhile, the gas added to oxygen gas during the photoresist strip has been under examination. To improve the ashing rate and exfoliation, fluorine-based reactive gases, and hydrogen-based reactive gases or a mixture of gases including hydrogen are used in addition to the oxygen gas as common process gases.

Subsequently, procedures including ACT wet cleaning and scrubbing are carried out to remove the residue stuck on the bottom and the sidewalls after stripping the photoresist. Recently, however, wet cleaning exhibits a problem in supplying ACT and it is not an economical process to perform. Also, in case of forming the inter-metal insulation layer 105 with a low-k insulation layer, the insulation layer may be attacked while being cleaned and thus the contact holes may have a bowing phenomenon. This will affect the step coverage in the subsequent procedures of metal deposition, causing a problem of reducing throughput.

SUMMARY OF THE DISCLOSURE

Therefore, a method for fabricating a semiconductor device is disclosed which include methods of photoresist stripping and cleaning, which show a favorable contact resistance by performing dry cleaning while stripping a photoresist and effectively removing the residue formed on contact holes.

A disclosed method for fabricating a semiconductor device comprises: a) forming an insulation layer on metal interconnection lines; b) forming a photoresist pattern on the insulation layer; c) etching the insulation layer and forming an opening through which part of the interconnection lines are exposed; and d) stripping the photoresist pattern and cleaning, wherein this step of stripping the photoresist and cleaning includes the steps of: removing the polymers formed on the sidewalls of the opening in a PR (photoresist) strip apparatus; removing the photoresist pattern in the PR strip apparatus; and removing the residue formed on the bottom of the opening in the PR strip apparatus.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PRESENTLY PREFERRED EMBODIMENTS

Figure 1:
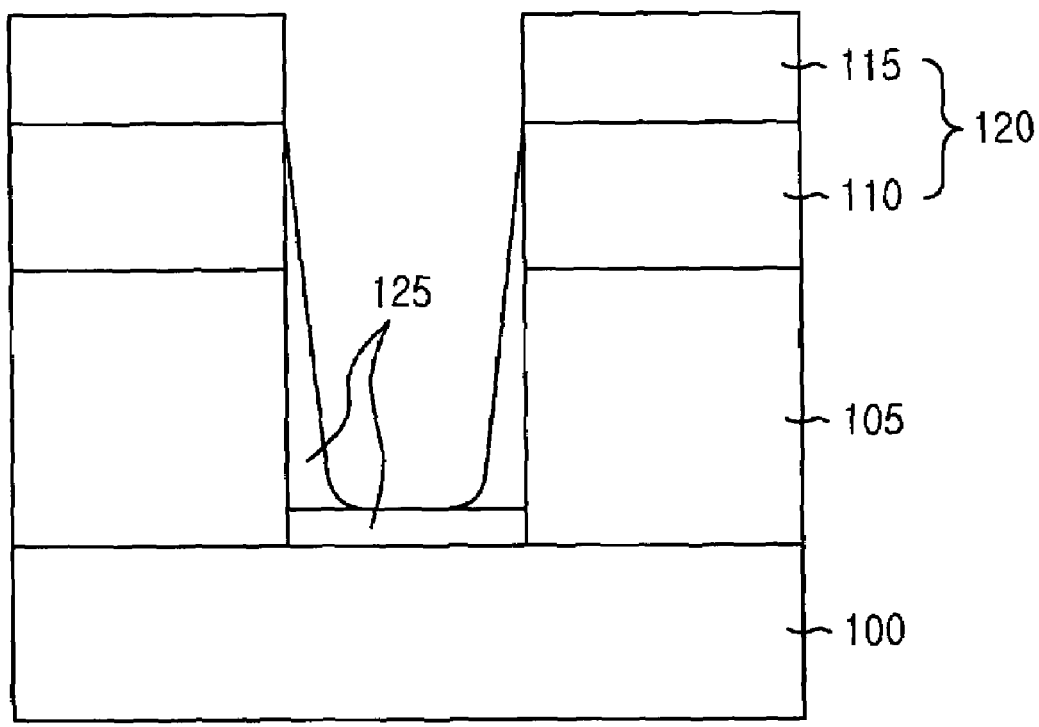
FIG. 1 is a cross-sectional view showing a semiconductor device after performing conventional via contact etching.

One method of stripping a photoresist and cleaning comprises the following three steps: a first and a third steps of removing of residue; and a second step of removing a bulk photoresist. A fourth step may include removing soluble corpuscles by rinsing them with the dionized (DI) water.

In the first step, the polymers on the sidewalls of an opening are removed. Here, a mixed gas plasma of $N_2H_2$, $H_2O$, $CF_4$ and $O_2$ is used, and a high frequency bias is supplied onto the substrate and a microwave is downstreamed on it.

In the second step, the bulk resist is removed. Here, a mixed gas plasma of $N_2$, $CF_4$ and $O_2$ is used and the microwave is used here as well.

In the third step, the residue on the bottom of the opening is removed. Here, a mixed gas plasma of $N_2$, $CF_4$ and $O_2$ is used and the microwave is also used. In the fourth step, soluble corpuscles are removed by being rinsed with the diionized (DI) water.

At this moment, rinsing refers to washing out a substrate with the DI water in order to remove chemicals or dusts on the surface of the substrate.

The opening is exposed in such a diverse form of a hole, line or bar. This is an economical process with low contact resistance, because the dry cleaning and the photoresist strip are carried out at the same time after the etching of the opening, and the wet solvent like ACT™ is not used here.

The apparatus for photoresist strip may employ a dual plasma source method that can use both radio frequency (RF) and microwave. It uses microwaves of 3 kW and 2.45 GHz and radio frequencies of 500 W and 13.56 MHz supplied to a plate as sources. Using a mixture of microwave downstream plasma and a radio frequency bias improves the ashing rates and cleaning capability.

In this process, $H_2O$ and $CF_4$ gases are used to form activated fluorine and OH radical in a microwave downstream plasma. A fluorine-based gas such as $CF_4$ improves the ashing rate and the post-etching residue removal. The procedure of DI water rinse, following the procedure of fluorine-based dry plasma cleaning, contributes a lot to remove the post-etch residue. Fluorination of an organic material generates a volatile scab and materials not volatilized are resolved in the DI water.

By way of an example, the metal interconnection line pattern of the lower part is formed of aluminum, and an inter-metal insulation layer is formed in a stack structure where 100Å of SiON and 5000Å of Hydrogen silsesquioxane (HSQ) are deposited; and after being cured for 30 minutes at 400° C., 5000Å of Silicon Rich Oxynitride (SRON) is deposited thereon.

Copper or tungsten can be used for the metal interconnection lines. As for inter-metal insulation layer, one can be selected from a group of SiON, SiOH, SiOC, SiOCH, PE-TEOS (Plasma Enhanced Tetra Ethyl Ortho Silicate), SRON (Silicon Rich Oxynitride), HDP (High Density Plasma) oxide layer and low-k insulation layer below the dielectric constant of 3.0, or a combination thereof. The low-k insulation layer reduces parasitic capacity between the interconnection lines together with copper interconnection lines and the interconnection line resistance, speeding up a semiconductor device. It is known as an alternative that can reduce the crosstalk of the device. Diverse kinds of low-k insulation layers are being developed and largely, they are classified into $SiO_2$-based (Si—O based) and carbon-based (C based) polymers. The $SiO_2$-based polymers are, again, divided into the FSG (Fluorine-doped Silicate Glass), HSQ (Hydrogen Silsesquioxane), inorganic SOG (Spin On Glass) and organic SOG (Spin On Glass). The carbon based polymers are classified according to if fluorine (F) is included or not.

After forming the inter-metal insulation layer and performing the via mask process and via etching, the procedures of stripping a photoresist and cleaning are carried out according to the process conditions shown in the below tables. In addition, the electric properties before and after the cleaning by the conventional ACT solvent will be compared hereinafter.

First, the photoresist strip and dry cleaning are performed under the conditions shown in Tables 1 and 2 and it is examined if the residue is removed, respectively. Then, the optimum condition for stripping a photoresist and dry cleaning is searched for by varying the process condition.

TABLE 1

| WF#01 | Pressure (mT) | Microwave (W) | RF (W) | $N_2H_2$ (sccm) | $O_2$ (sccm) | $CF_4$ (sccm) | $H_2O$ (sccm) | Temperature (° C.) | Time (sec.) |
|---|---|---|---|---|---|---|---|---|---|
| 1st | 1000 | 1700 | 450 | 1800 | — | 100 | 300 | 70 | 60 |
| 2nd | 700 | 1700 | — | — | 1500 | 100 | 125 | 70 | 60 |
| 3rd | 250 | — | 200 | — | 170 | 100 | 170 | 70 | 80 |

TABLE 2

| WF #02 | Pres-sure (mT) | Microwave (W) | RF (W) | $N_2H_2$ (sccm) | $O_2$ (sccm) | $CF_4$ (sccm) | $H_2O$ (sccm) | Temperature (° C.) | Time (sec.) |
|---|---|---|---|---|---|---|---|---|---|
| 1st | 1000 | 1700 | 450 | 1800 | — | 100 | 300 | 70 | 60 |
| 2nd | 700 | 1700 | — | — | 1500 | 100 | 125 | 70 | 60 |
| 3rd | 400 | — | 400 | 200 | 500 | 50 | — | 70 | 80 |

Under the conditions shown in the Tables 1 and 2, the above first, second and third steps are carried out on a wafer 1 and a wafer 2 (WF#01, WF#02). When examining them with an electron microscope, the residue around contact holes is not removed clearly after stripping the photoresist and rinsing with the DI water in both conditions. In case of the first process conditions, the surface of the inter-metal insulation layer seems to have been attacked.

The optimum process conditions are searched for by varying each processing variable and assessing how much photoresist is stripped and cleaned.

TABLE 3

| WF#03 | Pressure (mT) | Microwave (W) | RF (W) | $N_2H_2$ (sccm) | $O_2$ (sccm) | $CF_4$ (sccm) | $H_2O$ (sccm) | Temperature (° C.) | Time (sec.) |
| --- | --- | --- | --- | --- | --- | --- | --- | --- | --- |
| 1st | 1000 | 1700 | 100 | 1800 | — | 100 | 300 | 70 | 60 |
| 2nd | 700 | 1700 | — | — | 1500 | 100 | 125 | 70 | 60 |
| 3rd | 250 | — | 200 | — | 170 | 100 | 170 | 70 | 80 |

Table 3 shows process conditions when reducing the RF power of the first step from 450 W to 100 W, other conditions remaining the same as those of Table 1. With this condition, the photoresist is not removed completely. The reason is thought that the residue of the photoresist is not removed effectively in the first step.

TABLE 4

| WF#04 | Pressure (mT) | Microwave (W) | RF (W) | $N_2H_2$ (sccm) | $O_2$ (sccm) | $CF_4$ (sccm) | $H_2O$ (sccm) | Temperature (° C.) | Time (sec.) |
| --- | --- | --- | --- | --- | --- | --- | --- | --- | --- |
| 1st | 1000 | 1700 | 450 | 1800 | — | 50 | 300 | 70 | 60 |
| 2nd | 700 | 1700 | — | — | 1500 | 100 | 125 | 70 | 60 |
| 3rd | 250 | — | 200 | — | 170 | 100 | 170 | 70 | 80 |

Table 4 shows process conditions when reducing the $CF_4$ gas flow rate of the first step from 100 sccm to 50 sccm, other conditions kept the same as those of Table 1. With this condition, the photoresist is not removed completely.

TABLE 5

| WF#05 | Pressure (mT) | Microwave (W) | RF (W) | $N_2H_2$ (sccm) | $O_2$ (sccm) | $CF_4$ (sccm) | $H_2O$ (sccm) | Temperature (° C.) | Time (sec.) |
| --- | --- | --- | --- | --- | --- | --- | --- | --- | --- |
| 1st | 1000 | 1700 | 450 | 1800 | 500 | 100 | — | 70 | 60 |
| 2nd | 700 | 1700 | — | — | 1500 | 100 | 125 | 70 | 60 |
| 3rd | 250 | — | 200 | — | 170 | 100 | 170 | 70 | 80 |

Table 5 shows process conditions in which the $H_2O$ gas is removed from the conditions of Table 1 while 500 sccm of $O_2$ gas is added thereto, other conditions being the same as those of Table 1. With this condition, not all the photoresist is removed completely.

TABLE 6

| WF#06 | Pressure (mT) | Microwave (W) | RF (W) | $N_2H_2$ (sccm) | $O_2$ (sccm) | $CF_4$ (sccm) | $H_2O$ (sccm) | Temperature (° C.) | Time (sec.) |
| --- | --- | --- | --- | --- | --- | --- | --- | --- | --- |
| 1st | 1000 | 1700 | 450 | 1800 | — | 100 | 300 | 70 | 60 |
| 2nd | 700 | 1700 | — | — | 1500 | 100 | 125 | 250 | 60 |
| 3rd | 250 | — | 200 | — | 170 | 100 | 170 | 70 | 80 |

Table 6 shows process conditions when heightening the temperature of an electrode of the second step from 70° C. to 250° C., other conditions remaining the same as those of Table 1. With this condition, the photoresist is not removed completely.

TABLE 7

| WF#08 | Pressure (mT) | Microwave (W) | RF (W) | N₂H₂ (sccm) | O₂ (sccm) | CF₄ (sccm) | H₂O (sccm) | Temperature (° C.) | Time (sec.) |
|---|---|---|---|---|---|---|---|---|---|
| 1st | 1000 | 1700 | 450 | 1800 | — | 100 | 300 | 70 | 60 |
| 2nd | 700 | 1700 | — | — | 1500 | 50 | 125 | 70 | 60 |
| 3rd | 350 | — | 200 | 200 | 500 | 40 | — | 70 | 80 |

Table 7 shows process conditions in which the CF₄ gas of the second step is reduced and the pressure, RF power and CF₄ gas of the third step are declined, other conditions kept the same as those of Table 2. With this condition, the photoresist is not removed completely.

TABLE 8

| WF#09 | Pressure (mT) | Microwave (W) | RF (W) | N₂H₂ (sccm) | O₂ (sccm) | CF₄ (sccm) | H₂O (sccm) | N₂ (sccm) | Temperature (° C.) | Time (sec) |
|---|---|---|---|---|---|---|---|---|---|---|
| 1st | 1000 | 1700 | 450 | 1800 | — | 100 | 300 | — | 70 | 60 |
| 2nd | 700 | 1700 | — | — | 1500 | 50 | 125 | 125 | 70 | 60 |
| 3rd | 350 | — | 200 | 200 | 500 | 40 | — | — | 70 | 80 |

Table 8 shows process conditions when 125 sccm of N₂ is added in the second step of the conditions of Table 7. With this condition, the photoresist is not removed completely.

TABLE 9

| WF#07 | Pressure (mT) | Microwave (W) | RF (W) | N₂H₂ (sccm) | O₂ (sccm) | CF₄ (sccm) | H₂O (sccm) | N₂ (sccm) | Temperature (° C.) | Time (sec) |
|---|---|---|---|---|---|---|---|---|---|---|
| 1st | 300 | — | 400 | — | 400 | — | — | — | 70 | 40 |
| 2nd | 950 | 1700 | — | — | 2800 | — | — | 125 | 270 | 70 |
| 3rd | 1300 | 1700 | — | — | 3000 | 30 | — | 500 | 270 | 20 |
| 4th | 1300 | 1700 | — | 3000 | — | — | — | — | 270 | 20 |

Unlike other wafers, Table 9 shows process conditions applying the condition of high energy implant photoresist strip, which is already set up. With this condition, the photoresist is not removed completely.

TABLE 10

| WF#10 | Pressure (mT) | Microwave (W) | RF (W) | N₂H₂ (sccm) | O₂ (sccm) | CF₄ (sccm) | H₂O (sccm) | N₂ (sccm) | Temperature (° C.) | Time (sec) |
|---|---|---|---|---|---|---|---|---|---|---|
| 1st | 300 | — | 400 | — | 400 | — | — | — | 70 | 40 |
| 2nd | 950 | 1700 | — | — | 2800 | — | — | 125 | 270 | 70 |
| 3rd | 1300 | 1700 | — | — | 3000 | 30 | 300 | 500 | 270 | 20 |
| 4th | 1300 | 1700 | — | 3000 | — | — | — | — | 270 | 20 |

Table 10 shows process conditions when 300 sccm of H₂O gas is added in the third step of the conditions of Table 9. With this condition, the photoresist is not removed completely.

TABLE 11

| WF#11 | Pressure (mT) | Microwave (W) | RF (W) | $N_2H_2$ (sccm) | $O_2$ (sccm) | $CF_4$ (sccm) | $H_2O$ (sccm) | $N_2$ (sccm) | Temperature (° C.) | Time (sec) |
|---|---|---|---|---|---|---|---|---|---|---|
| 1st | 1000 | 1700 | 450 | 1800 | 400 | 40 | 300 | — | 70 | 60 |
| 2nd | 700 | 1700 | — | — | 1500 | 40 | — | 150 | 70 | 60 |
| 3rd | 700 | 1700 | — | — | 1000 | 40 | 300 | 150 | 70 | 80 |

Table 11 shows optimum process conditions.

After performing the photoresist strip and clearing under the conditions of Table 11, residue can be removed completely.

The process conditions of Tables 3 to 10 show similar results that the residue is almost removed with a little of it left around the holes, just except the case of conditions shown in Table 1 where the RF power is lowered. Accordingly, with a little change in a parameter, it is estimated to be hard to remove the entire residue. So, new conditions are searched for.

The conditions of Table 11 are set up in consideration of the test results of Tables 1 to 10, preparatory tests conducted before adopting the vapor delivery system (VDS) and implant photoresist strip condition that has been already set up.

In overall, the amount of $CF_4$ is reduced from the conditions of Tables 1 and 2, and $O_2$ gas is added in the first step. In the second and the third steps, as it's considered favorable to use a microwave than to use RF power, the RF power is substituted with a microwave and $N_2$ gas is added. Also, in the third step, the pressure, amounts of $O_2$ gas and $H_2O$ are increased.

Accordingly, in the first step, the polymers on the sidewalls are removed in the atmosphere of mixed gases of $N_2H_2$, $H_2O$, $CF_4$ and $O_2$ by using RF power and microwave, the amount of $N_2H_2$ gas range from about 500 to about 2500 sccm; $H_2O$ gas range from about 50 to about 500 sccm; $CF_4$ gas range from about 10 to about 100 sccm; and $O_2$ gas range from about 100 to about 500 sccm.

In the second step, a photoresist is removed in the atmosphere of mixed gases of $N_2$, $CF_4$ and $O_2$, the amount of $N_2$ gas range from about 50 to about 500 sccm; $CF_4$ gas range from about 10 to about 100 sccm; and $O_2$ gas range from about 100 to about 2000 sccm.

In the third step, the residue on the bottom of via holes is removed in the atmosphere of mixed gases of $N_2$, $H_2O$, $CF_4$ and $O_2$ by using a microwave, the amount of $N_2$ gas range from about 50 to about 500 sccm; $H_2O$ gas range from about 50 to about 500 sccm; $CF_4$ gas range from about 10 to about 100 sccm; and $O_2$ gas range from about 100 to about 2000 sccm.

In the fourth step of the present invention, the substances that have not been volatilized in the above procedures are removed by being rinsed with the DI water. The RF power of the PR strip apparatus used in the first through third steps is supplied up to about 2500 W and the microwave is supplied up to 500 W. Also, the temperature of the chamber wall and platen of the PR strip apparatus range from about 20° C. to 90° C., while the temperature of the upper part range from about 150 to about 270° C.

The above tests results in new process conditions for stripping a photoresist and cleaning. Herein below, the electric properties of the disclosed methods will be compared with those of the conventional method of stripping a photoresist and wet cleaning with ACT.

Figure 2:
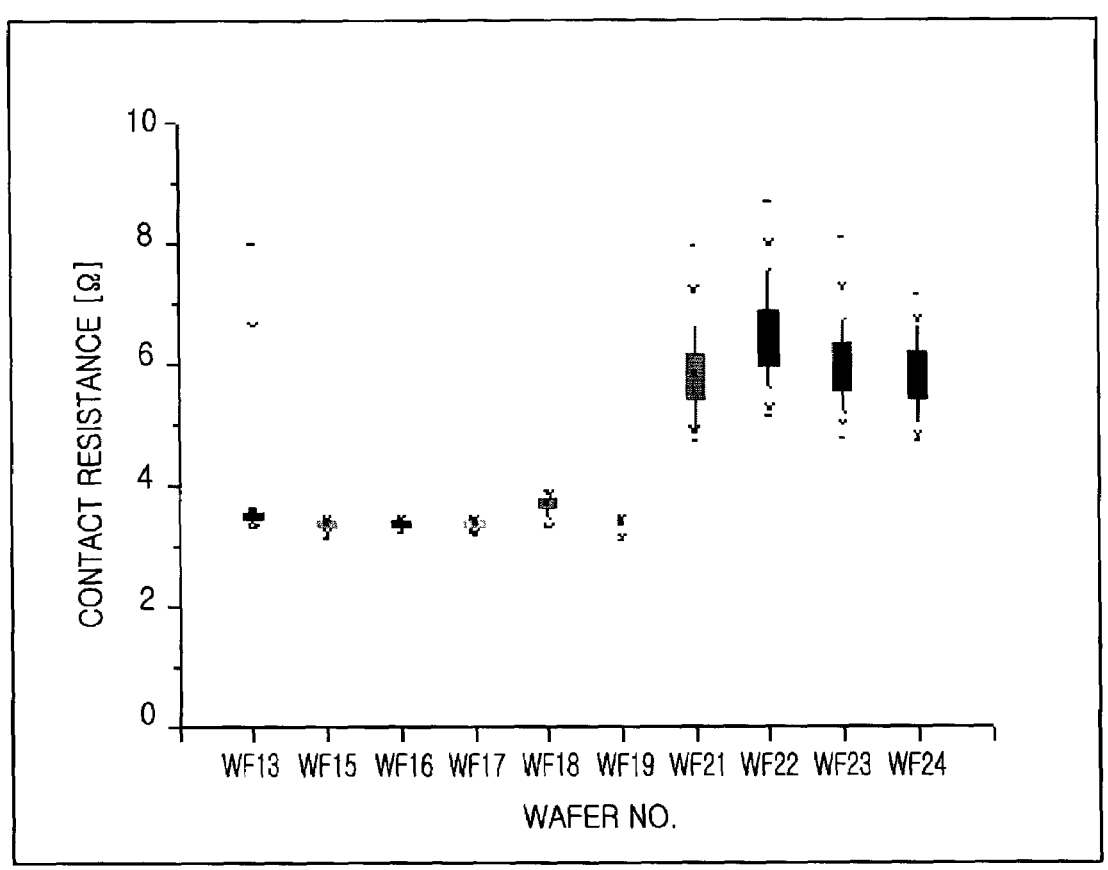
FIG. 2 is a graph measuring via contact resistance of each wafer.

FIG. 2 is a graph measuring via contact resistance of each wafer.

The wafers No. 21 to 24 (WF#21~#24) are processed in the same way as they have been conventionally done till the procedure of etching via holes, then the conventional PR strip and ACT wet cleaning are carried out and pad pattern is conducted thereon.

The wafer No. 13 to 19 (WF#13~19) are processed in the same way as they have been conventionally done till the procedure of etching via holes, then the PR strip and dry cleaning is carried out in accordance with the disclosure and pad pattern is conducted thereon.

As shown in the graph, the photoresist strip and cleaning method of the disclosure presents low contact resistance as well as low deviation of contact resistance between the dies.

Although, the above embodiment concerns the photoresist strip and cleaning process after etching via contact holes, the disclosed method can be applied to any other photoresist strip and cleaning processes fabricating various openings whose substructure is formed of a metal hole, line or bar.

The disclosed methods described above reduce production cost as well as increasing the throughput by substituting the photoresist strip and ACT wet cleaning procedure after the via contact etching in a semiconductor with a method of dry cleaning to be performed while a photoresist is removed in the conventional PR strip apparatus. In addition, it can shorten waiting time and maintain consistency in process by performing the photoresist strip and cleaning at the same time in the same chamber. This disclosed methods lower via contact resistance and its deviation, compared to the conventional photoresist strip and ACT wet cleaning.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor device comprising:

forming an insulation layer on metal interconnection lines;

forming a photoresist pattern on the insulation layer;

etching the insulation layer and forming an opening through which part of the interconnection lines are exposed, said opening comprising sidewalls; and stripping the photoresist pattern and cleaning the resulting structure, wherein the stripping the photoresist and cleaning comprises:

removing the polymers formed on the sidewalls of the opening using a photoresist (PR) strip apparatus, wherein the polymers comprise volatile materials and are removed in a first plasma of mixed gases including $N_2H_2$, $H_2O$, $CF_4$ and $O_2$ gases;

removing the photoresist pattern in the PR strip apparatus; and removing residue formed on the bottom of the opening in the PR strip apparatus.

2. The method as recited in claim 1, wherein the stripping the photoresist and cleaning further comprises rinsing with DI water after the step of removing the residue.

3. The method as recited in claim 1, wherein, in removing the polymers, RE bias is supplied onto the substrate and then a microwave is downstreamed thereon.

4. The method as recited in claim 1, wherein, in the removing the photoresist pattern, a second plasma is formed in the PR strip apparatus using a microwave.

5. The method as recited in claim 1, wherein, in removing of the residue formed on the bottom of the opening, a third plasma of mixed gases is used, the plasma being formed using a microwave.

6. The method as recited in claim 1, wherein an amount of $N_2H_2$ gas ranging from about 500 to about 2500 sccm; an amount of $H_2O$ gas ranging from about 50 to about 500 sccm; an amount of $CF_4$ gas ranging from about 10 to about 100 sccm; and an amount of $O_2$ gas ranging from about 100 to about 500 sccm.

7. The method as recited in claim 4, wherein the second plasma of mixed gases comprise $N_2$, $CF_4$ and $O_2$.

8. The method as recited in claim 7, wherein an amount of $N_2$ gas ranging from about 50 to about 500 sccm; an amount of $CF_4$ gas ranging from about 10 to about 100 sccm; and an amount of $O_2$ gas ranging from about 100 to about 2000 sccm.

9. The method as recited in claim 5, wherein the third plasma of mixed gases comprises $N_2$, $H_2O$, $CF_4$ and $O_2$ gases.

10. The method as recited in claim 9, wherein an amount of $N_2$ gas ranging from about 50 to about 500 sccm; an amount of $H_2O$ gas ranging from about 50 to about 500 sccm; an amount of $CF_4$ gas ranging from about 10 to about 100 sccm; and an amount of $O_2$ gas ranging from about 100 to about 2000 sccm.

11. The method as recited in claim 1, wherein in stripping of the photoresist and cleaning the resulting structure, a temperature of a chamber wall and a platen of the PR strip apparatus ranges from about 20 to about 90° C., while a temperature of an upper part of the PR strip apparatus ranges from about 150 to about 270° C.

12. The method as recited in claim 1, wherein the metal interconnection lines are formed of a material selected from the group consisting of aluminum, copper, tungsten, and combinations thereof.

13. The method as recited in claim 1, wherein the insulation layer is formed of a material selected from the group consisting of SiON, SiOC, SiOCN, PE-TEOS, SRON, HDP oxide layer, low-k insulation layer, and combinations thereof.

14. The method as recited in claim 1, wherein the insulation layer is formed of SiON, HSQ and SRON stacked in order.

15. A method for fabricating a semiconductor device comprising:
   forming an insulation layer on metal interconnection lines, the insulation layer comprising stacked layers of SiON, HSQ and SRON in order;
   forming a photoresist pattern on the insulation layer;
   etching the insulation layer and forming an opening through which part of the interconnection lines are exposed, said opening comprising sidewalls; and
   stripping the photoresist pattern and cleaning the resulting structure, wherein the stripping the photoresist and cleaning comprises:
   removing the polymers formed on the sidewalls of the opening using a photoresist (PR) strip apparatus, wherein the polymers comprise volatile materials and are removed in a first plasma of mixed gases including $N_2H_2$, $H_2O$, $CF_4$, and $O_2$ gases;
   removing the photoresist pattern in the PR strip apparatus; and
   removing residue formed on the bottom of the opening in the PR strip apparatus.

16. The method as recited in claim 15, wherein an amount of $N_2H_2$ gas ranging from about 500 to about 2500 sccm; an amount of $H_2O$ gas ranging from about 50 to about 500 sccm; an amount of $CF_4$ gas ranging from about 10 to about 100 sccm; and an amount of $O_2$ gas ranging from about 100 to about 500 sccm.

17. A method for fabricating a semiconductor device comprising:
   forming an insulation layer on metal interconnection lines, the insulation layers comprising SiON, HSQ and SRON layers;
   forming a photoresist pattern on the insulation layer;
   etching the insulation layer and forming an opening through which part of the interconnection lines are exposed, said opening comprising sidewalls; and
   stripping the photoresist pattern and cleaning the resulting structure, wherein the stripping the photoresist and cleaning comprises:
   removing the polymers formed on the sidewalls of the opening using a photoresist (PR) strip apparatus, wherein the polymers comprise volatile materials and are removed in a first plasma of mixed gases including $N_2H_2$, $CF_4$, $O_2$ and $H_2O$ gases;
   removing the photoresist pattern in the PR strip apparatus; and
   removing residue formed on the bottom of the opening in the PR strip apparatus.

* * * * *